United States Patent
Chooi et al.

(10) Patent No.: US 6,340,608 B1
(45) Date of Patent: Jan. 22, 2002

(54) METHOD OF FABRICATING COPPER METAL BUMPS FOR FLIP-CHIP OR CHIP-ON-BOARD IC BONDING ON TERMINATING COPPER PADS

(75) Inventors: Simon Chooi; Yakub Aliyu; Mei Sheng Zhou; John Sudijono; Subhash Gupta; Sudipto Ranendra Roy; Paul Ho; Xu Yi, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/612,564

(22) Filed: Jul. 7, 2000

(51) Int. Cl.$^7$ .................................................. H01L 21/50
(52) U.S. Cl. .................................... 438/108; 438/613
(58) Field of Search .............................. 438/108, 612, 438/613, 614, FOR 340, FOR 343, FOR 347; 257/737, 738, 750, 758, 778

(56) References Cited

U.S. PATENT DOCUMENTS

| | | | |
|---|---|---|---|
| 5,296,334 A | * | 3/1994 | Castaldi et al. |
| 5,387,493 A | * | 2/1995 | Imabayashi et al. |
| 5,492,611 A | * | 2/1996 | Sugama et al. |
| 5,767,009 A | | 6/1998 | Yoshida et al. ............. 438/613 |
| 5,795,818 A | | 8/1998 | Marrs ......................... 438/612 |
| 5,804,876 A | | 9/1998 | Lake et al. ................. 257/737 |
| 5,846,853 A | * | 12/1998 | Otsuki et al. |
| 5,853,957 A | * | 12/1998 | Yanagawa et al. |
| 5,856,068 A | * | 1/1999 | Magera et al. |
| 5,891,756 A | | 4/1999 | Erickson ..................... 438/108 |
| 5,904,859 A | | 5/1999 | Degani ........................ 216/18 |
| 5,910,390 A | * | 6/1999 | Hatanaka et al. |
| 5,914,216 A | * | 6/1999 | Amou et al. |
| 5,923,955 A | | 7/1999 | Wong ......................... 438/108 |
| 6,133,534 A | * | 10/2000 | Fukotomi et al. |
| 6,156,870 A | * | 12/2000 | Morita et al. |
| 6,225,035 B1 | * | 5/2001 | Zhang et al. |
| 6,228,465 B1 | * | 5/2001 | Takiguchi et al. |

FOREIGN PATENT DOCUMENTS

JP 200088885 A * 3/2000

* cited by examiner

*Primary Examiner*—George Fourson
*Assistant Examiner*—Thanh V Pham
(74) *Attorney, Agent, or Firm*—George O. Saile; Rosemary L. S. Pike; Stephen G. Stanton

(57) ABSTRACT

A semiconductor chip having an exposed metal terminating pad thereover, and a separate substrate having a corresponding exposed metal track thereover are provided. A metal bump is formed over the exposed metal terminating pad. A photosensitive resin plug is formed over the metal bump. The metal bump of the semiconductor chip is aligned with the corresponding metal track on the separate substrate. The photosensitive resin plug over the metal bump is mated with the corresponding the metal track. The photosensitive resin plug is exposed to UV light to cure the photosensitive resin plug, permanently attaching the metal bump of the semiconductor chip to the corresponding metal track of the separate substrate.

11 Claims, 3 Drawing Sheets

US 6,340,608 B1

METHOD OF FABRICATING COPPER METAL BUMPS FOR FLIP-CHIP OR CHIP-ON-BOARD IC BONDING ON TERMINATING COPPER PADS

BACKGROUND OF THE INVENTION

Semiconductor chips with copper interconnect termination pads are now readily available in the market. These are mostly packaged utilizing flip-chip, Chip-on-Board, and Micron Metal Bonding using small eutectic solder bumps or ball joint material. Solder joint fatigue and life of the joint is dominated by the coefficient of thermal expansion mismatch of the solder metal, wetting material, and the substrate metal pad. The present invention overcomes these limitations by providing a technique for packaging and chip assemblies using low cost materials and superior technology.

U.S. Pat. No. 5,923,955 to Wong describes a process for creating a flip-chip bonded combination for a first and second integrated circuits using a Ni/Cu/TiN structure.

U.S. Pat. No. 5,891,756 to Erickson describes a method for forming a solder bump pad, and specifically to converting a wire bond pad of a surface-mount IC device to a flip-chip solder bump pad such that the IC device can be flip-chip mounted to a substrate. The method uses a Ni layer over the pad.

U.S. Pat. No. 5,795,818 to Marrs describes a method of forming an interconnection between bonding pads on an integrated circuit chip and corresponding bonding contacts on a substrate. The method uses coined ball bond bumps.

U.S. Pat. No. 5,904,859 to Degani describes a method for applying under bump metallization (UBM) for solder bump interconnections on interconnection substrates. The UBM comprises a Cu, Cu/Cr, Cr multilayer structure.

U.S. Pat. No. 5,767,009 to Yoshida et al. describes a method of reducing cross talk noise between stacked semiconductor chips by the use of a chip on chip mounting structure.

U.S. Pat. No. 5,804,876 to Lake et al. describes a low contact resistance electrical bonding interconnect having a metal bond pad portion and conductive epoxy portion.

SUMMARY OF THE INVENTION

Accordingly, it is an object of the present invention to provide a method of bonding a chip to a substrate without the use of a multilevel component of an adhesive layer, barrier metal layer, cap layer and wetting metal layer.

Another object of the present invention is to provide a method of bonding a chip to a substrate by low cost, low inductance and low capacitance connections.

Other objects will appear hereinafter.

It has now been discovered that the above and other objects of the present invention may be accomplished in the following manner. Specifically, a semiconductor chip having an exposed metal terminating pad thereover, and a separate substrate having a corresponding exposed metal track thereover are provided. A metal bump is formed over the exposed metal terminating pad. A photosensitive resin plug is formed over the metal bump. The metal bump of the semiconductor chip is aligned with the corresponding metal track on the separate substrate. The photosensitive resin plug over the metal bump is mated with the corresponding the metal track. The photosensitive resin plug is exposed to UV light to cure the photosensitive resin plug, permanently attaching the metal bump of the semiconductor chip to the corresponding metal track of the separate substrate.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Figure 1:
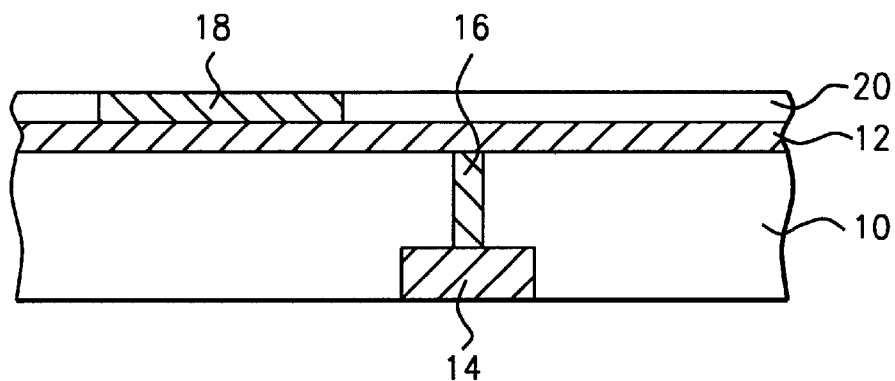
FIGS. 1 through 10 schematically illustrate in cross-sectional representation a preferred embodiment of the present invention.

Accordingly, as shown in FIG. 1, semiconductor structure 10 includes an overlying final metal layer 12 connected to, for example, metal line 14 through metal via 16. Metal terminating pad 18 overlies final metal layer 12 at a predetermined position within first passivation layer 20.

Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure 10" is meant to include a semiconductor chip.

Final metal layer 12 and metal terminating pad 18 are preferably comprised of copper as will be used for illustrative purposes hereafter.

Additional metal vias 16, metal lines 14, metal terminating pads 18, etc., may be formed within and over semiconductor structure 10 although for purposes of illustration, only single such structures will be shown in FIGS. 1–7.

Figure 2:
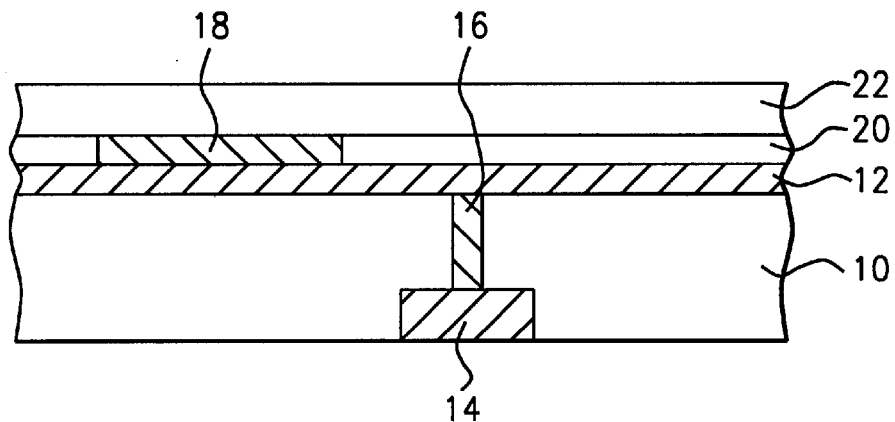

As shown in FIG. 2, final passivation layer 22 is formed over first passivation layer 20 and copper terminating pad 18 to a thickness of from about 1000 to 10,000 Å, and more preferably from about 2000 to 5000 Å. Final passivation layer 22 includes, but is not restricted to, silicon nitride, silicon oxynitride and BLok (from Applied Materials Corp.)

Figure 3:
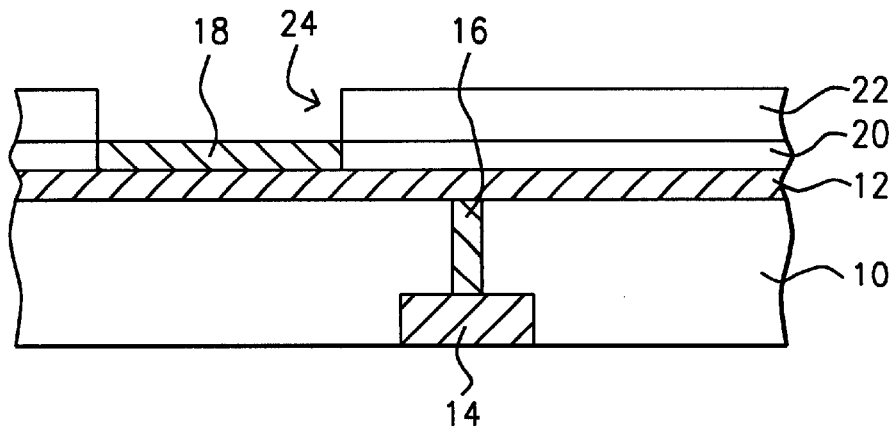

As shown in FIG. 3, opening 24 is formed within second passivation layer 22 exposing copper terminating pad 18.

Figure 4:
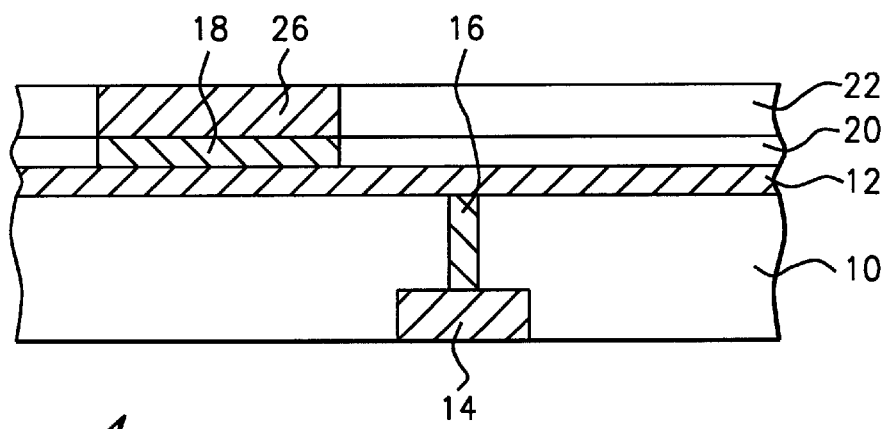

As shown in FIG. 4, metal bump 26 is grown within opening 24 by selective electroless copper plating to a thickness of from about 1000 to 15,000 Å, and more preferably from about 5000 to 10,000 Å. Metal bump 26 is preferably formed of copper as will be used for illustrative purposes hereafter. As shown in FIG. 4, the selective growth of copper metal bump 26 can be performed using final passivation layer 22 as a mask. A chemical mechanical polishing of the copper may be performed to ensure planarity of the copper metal bump with the final passivation layer 22.

Copper metal bump 26 replaces the traditional layers of metal used in conventional solder Bump Flip-Chip Bonding. Direct formation of copper metal bump 26 replaces an adhesive layer, barrier metal layer, cap layer, and wetting metal layer in addition to the solder otherwise required in conventional solder Bump Flip-chip Bonding.

Figure 5:
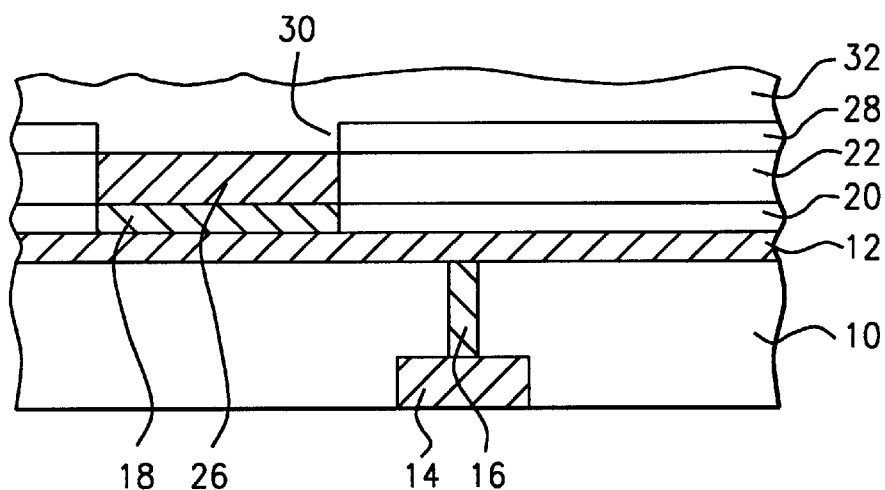

As shown in FIG. 5, dielectric mask layer 28 is formed over final passivation layer 22 and copper metal bump 26. Opening 30 is formed within dielectric mask layer 28, exposing copper metal bump 26.

Photosensitive resin 32 is formed over dielectric mask layer 28, filling opening 30.

Figure 6:
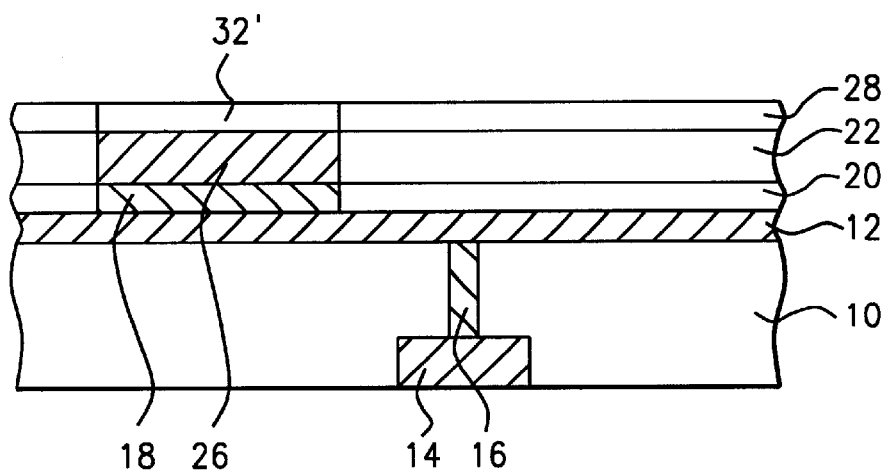

As shown in FIG. 6, in a key step of the invention, the excess of photosensitive resin 32 is removed from dielectric mask 28, leaving photosensitive resin plug 32' over copper metal bump 26.

Photosensitive resin 32 is conductive and is specially formulated and includes but is not restricted to polyimide, polyacetylene or polyanile (PANI) (a copper photosensitive resin) produced by DuPont, Ciba Geigy, Sieman's or others. Photosensitive resin 32 will be referred to as copper resin 32 and copper resin plug 32' hereafter.

Figure 7:
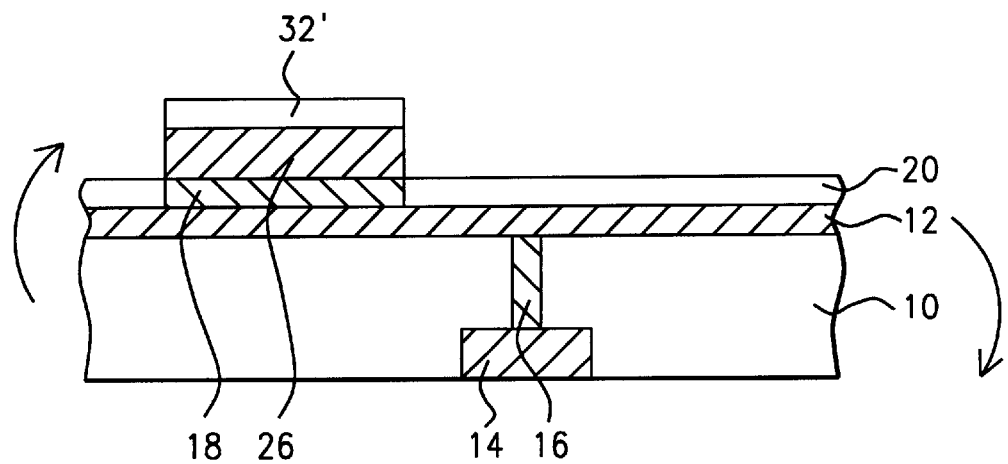

As shown in FIG. 7, dielectric mask layer 28 and final passivation layer 22 are removed, exposing copper metal bump 26 with overlying copper resin plug 32'.

Figure 8:
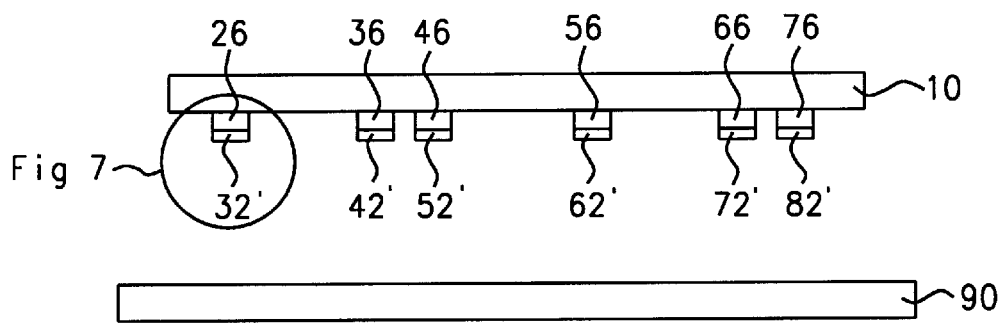
Figure 9:
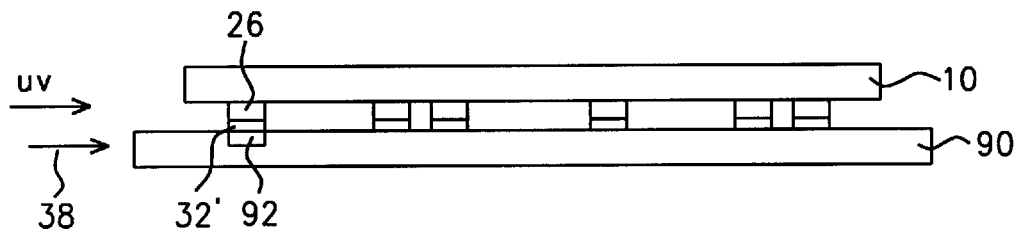
Figure 10:
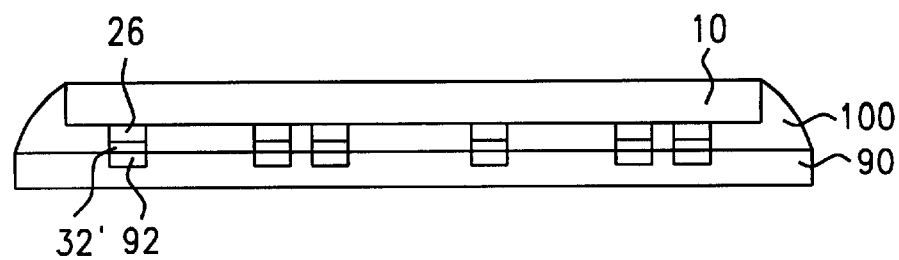

As shown in FIGS. 8–10, the final stage of the chip bonding is to affix chip 10 (semiconductor structure 10) to a substrate, i.e. substrate 90. Substrate 90 may include, for example, a board or printed circuit board. This can be accomplished in the preset invention by utilizing the adhesive characteristic properties of the specially formulated copper resin 32 comprising copper resin plugs 32'.

As shown in FIG. 8, chip 10 includes, for example, copper metal bumps/copper resin plugs 26/32'; 36/42'; 46/52'; 56/62'; 66/72'; 76/82' with the structure of FIG. 7 shown in circle "FIG. 7" of FIG. 8. Chip 10 is flipped over (hence flip-chip bonding) as shown in FIG. 7 and aligned over substrate 90 as shown in FIG. 8. This is very critical and is important to avoid any effects that can perturb the electrical connections and introduce effects detrimental to the interconnect.

As shown in FIG. 9, aligned chip 10 and substrate 90 are mated, with resin plugs 32', 42', 52', 62', 72', 82' preferably contacting corresponding copper substrates, or copper tracks 92 embedded in an organic laminate, on substrate 90.

Copper resin 32 is photosensitive, as noted above, and is cured using UV light 38 from a UV light source (not shown) to set and allow chip 10 to attach and bond directly onto copper substrates on substrate 90.

Copper resin 32 comprising copper resin plugs 32' may also provide a stress cushion that may be imparted between the copper-copper surfaces after deposition. Mild compressive stress results from the strength of copper resin 32 after setting and curing which further provides mechanical support to chip 10 on substrate 90.

As shown in FIG. 10, dielectric material 100 is formed within the interstices between chip 10 and substrate 90 by flowing dielectric material 100 therein. Dielectric material 100 serves to passivate and insulate the structure of FIG. 10.

Thus, the present invention will have an impact in the industry by providing a method of fabricating a low cost, low inductance, and low capacitance connection between copper terminated IC chip pads and copper tracks embedded in an organic laminate. This process can be used mostly for the low-end computer packaging to meet requirements for small and compact sizing of computers and other electronic circuits. The process can also satisfy the needs of the inevitable tendency towards larger chip size and narrower pitched multipins and smaller pad areas using low cost materials and superior technology.

While particular embodiments of the present invention have been illustrated and described, it is not intended to limit the invention, except as defined by the following claims.

We claim:

1. A method of bonding a chip to a substrate, comprising the steps of:

providing a semiconductor chip having an exposed metal terminating pad thereover, and a separate substrate having a corresponding exposed metal track thereover;

forming a metal bump over said exposed metal terminating pad;

forming a photosensitive resin plug over said metal bump;

aligning said metal bump of said semiconductor chip with said corresponding metal track;

mating said photosensitive resin plug over said metal bump with said corresponding metal track; and exposing said photosensitive resin plug with UV light to cure said photosensitive resin plug, permanently attaching said metal bump of said semiconductor chip to said corresponding metal track of said separate substrate.

2. The method of claim 1, wherein said metal bump is from about 1000 to 10,000 Å thick.

3. The method of claim 1, wherein said exposed metal terminating pad, metal bump, and said metal tracks are comprised of copper.

4. The method of claim 1, wherein said photosensitive resin plug is comprised of a material selected from the group consisting of polyimide, polyacetylene and polyanile (PANI).

5. A method of bonding a chip to a substrate, comprising the steps of:

providing a semiconductor chip having a metal terminating pad thereover, and a separate substrate having a corresponding exposed metal track thereover;

forming a final passivation layer over said metal terminating pad;

forming an opening in said final passivation layer exposing said metal terminating pad;

forming a metal bump within said final passivation layer opening and over said exposed metal terminating pad;

forming a dielectric mask layer over said metal bump and said final passivation layer; forming an opening in said dielectric mask layer exposing said metal bump;

forming a photosensitive resin plug within said dielectric mask layer opening over said metal bump;

aligning said metal bump of said semiconductor chip with said corresponding metal track;

mating said photosensitive resin plug over said metal bump with said corresponding metal track; and exposing said photosensitive resin plug with UV light to cure said photosensitive resin plug, permanently attaching said metal bump of said semiconductor chip to said corresponding metal track of said separate substrate.

6. The method of claim 5, wherein said metal bump is from about 1000 to 10,000 Å thick.

7. The method of claim 5, wherein said exposed metal terminating pad, metal bump, and said metal tracks are comprised of copper.

8. The method of claim 5, wherein said photosensitive resin plug is comprised of a material selected from the group consisting of polyimide, polyacetylene and polyanile (PANI).

9. A method of bonding a chip to a substrate, comprising the steps of:

provoking a semiconductor chip having an exposed copper terminating pad thereover, and a separate substrate having a corresponding exposed copper track thereover;

forming a copper bump over said exposed copper terminating pad;

forming a photosensitive resin plug over said copper bump;

aligning said copper bump of said semiconductor chip with said corresponding copper track;

mating said photosensitive resin plug over said copper bump with said corresponding copper track; and exposing said photosensitive resin plug with UV light to cure said photosensitive resin plug, permanently attaching said copper bump of said semiconductor chip to said corresponding copper track of said separate substrate.

10. The method of claim 9, wherein said photosensitive resin plug is comprised of a material selected from the group consisting of polyimide, polyactelyene and polyanile (PANI).

11. The method of claim 9, wherein said copper bump is from about 1000 to 10,000 Å thick.

\* \* \* \* \*